United States Patent [19]

Ellenberger

[11] Patent Number: 4,820,370
[45] Date of Patent: Apr. 11, 1989

[54] PARTICLE SHIELDED R. F. CONNECTOR FOR A PLASMA ENHANCED CHEMICAL VAPOR PROCESSOR BOAT

[75] Inventor: Charles E. Ellenberger, Elko, Nev.

[73] Assignee: Pacific Western Systems, Inc., Mountain View, Calif.

[21] Appl. No.: 941,030

[22] Filed: Dec. 12, 1986

[51] Int. Cl.[4] .................. H01J 37/00; C23C 16/00
[52] U.S. Cl. .................. 156/345; 156/643; 118/723; 118/50.1; 118/504
[58] Field of Search .................. 118/723, 50.1, 504; 156/345, 643; 204/298

[56] References Cited

U.S. PATENT DOCUMENTS

| | | | |
|---|---|---|---|
| 2,228,237 | 1/1941 | Sofield et al. | 339/211 X |
| 2,877,437 | 3/1959 | Flanagan | 339/211 X |
| 3,588,789 | 6/1971 | Kailus | 339/211 X |
| 4,223,048 | 9/1980 | Engle, Jr. | 118/723 X |
| 4,448,149 | 5/1984 | Brown et al. | 118/723 X |
| 4,508,053 | 4/1985 | Eriksson | 118/50.1 X |
| 4,625,678 | 12/1986 | Shioya et al. | 118/723 |

FOREIGN PATENT DOCUMENTS 59-46022  3/1984  Japan .................. 118/50.1

*Primary Examiner*—David L. Lacey
*Assistant Examiner*—Andrew J. Anderson
*Attorney, Agent, or Firm*—Harry E. Aine

[57] ABSTRACT

The wafer processing boat of a plasma enhanced chemical vapor processor includes an R.F. connector at the inner end of its interleaved electrodes. The R.F. electrical connector includes slidably mated male and female portions for making R.F. electrical connection to the boat through the end wall of the evacuable furnace tube. A particle shield surrounds the mated male and female R.F. connector portions for confinement of particulates released during the mating of the connector. The shield includes an open end which faces downstream of the flow of processing gases to reduce backstreaming of particulates onto the wafers. The electrical male conductors of the connector are covered by a quartz sheath.

6 Claims, 2 Drawing Sheets

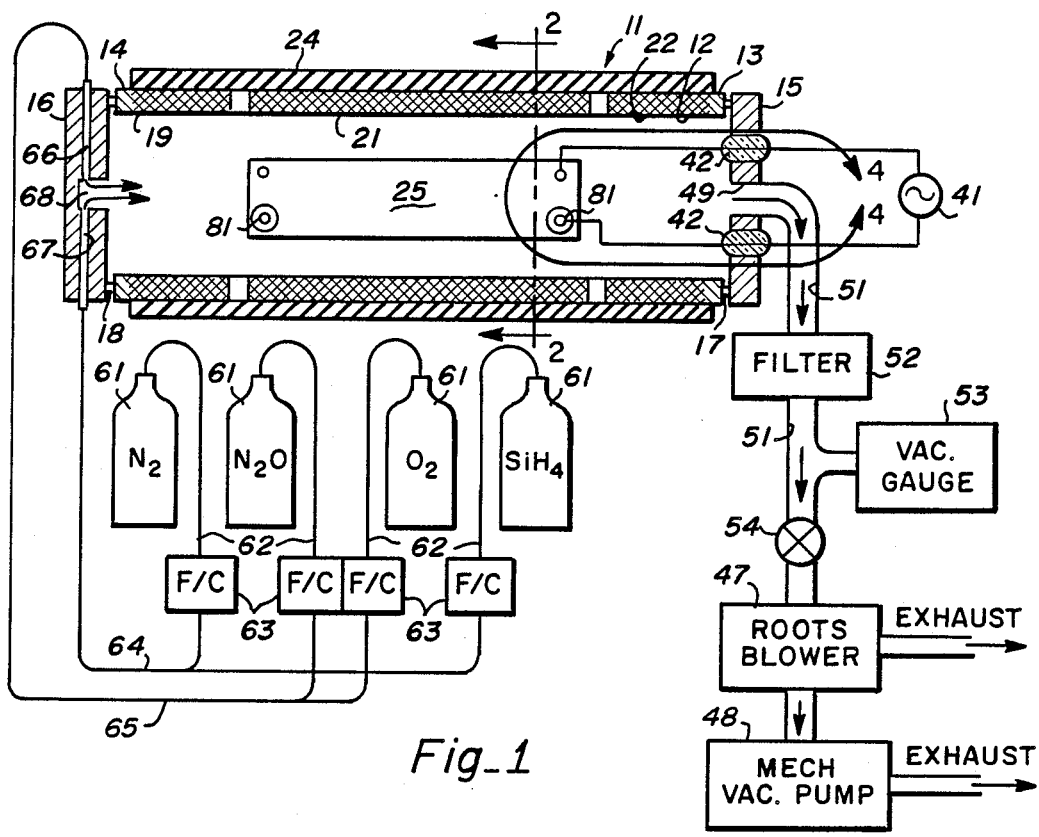
Fig_1
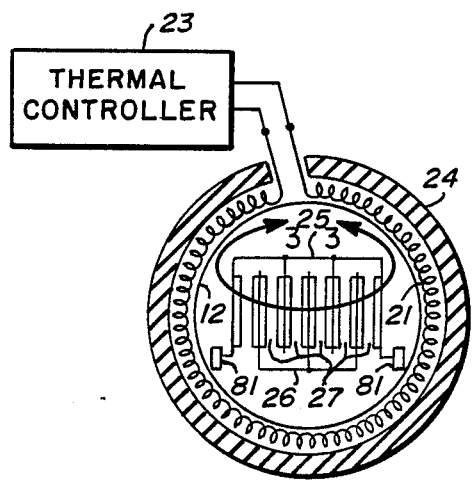
Fig_2
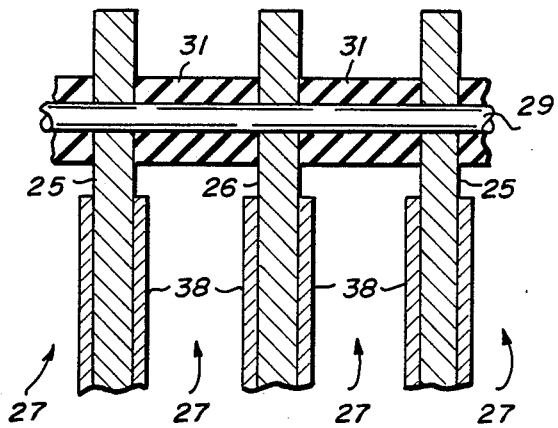
Fig_3

PARTICLE SHIELDED R. F. CONNECTOR FOR A PLASMA ENHANCED CHEMICAL VAPOR PROCESSOR BOAT

BACKGROUND OF THE INVENTION

The present invention relates in general to an improved wafer processing boat for a plasma enhanced chemical vapor processor and, more particularly, to such a boat having a particle shield surrounding the RF connector.

DESCRIPTION OF THE PRIOR ART

Heretofore, plasma enhanced chemical vapor processor boats for processing (etching or coating) semiconductive wafers have employed an RF connector at the inner end of the boat for supplying RF power to the boat. The boat, containing wafers, slides axially into an evacuable furnace tube and an electrical connector is provided at the inner end of the boat. The electrical connector includes slidably mating contacts protruding into the furnace tube from the inner end thereof for supplying RF power to the interleaved electrodes of the boat for establishing a plasma discharge in the processing gaps between the interleaved electrodes. Such a chemical vapor processor and boat is disclosed in U.S. Pat. No. 4,223,048 issued 16 Sept. 1980, the disclosure of which is hereby incorporated by reference in its entirety.

One of the problems encountered in the prior art wafer processor is that particles flake off of the slidably mating metal portions of the RF electrical connector at the end of the boat inside the furnace tube. The dislodged particles produce undesired particulate contamination of the wafers being processed.

It would be desirable to provide an RF electrical connector system for the boat which reduced particulate contamination.

SUMMARY OF THE PRESENT INVENTION

The principal object of the present invention is the provision of an improved slidable RF connector system for the boat of a plasma enhanced chemical vapor processor.

In one feature of the present invention, a particulate shield is disposed surrounding the mating male and female portions of a slidably mating RF connector employed for coupling RF power to the boat of a plasma enhanced chemical vapor processor, whereby particles dislodged from the connector are confined to spaces remote from the wafers being processed, thereby reducing particulate contamination of the wafers being processed.

In another feature of the present invention, the particulate shield contains an open-end portion facing downstream of the flow of processing gases through the wafer processing boat, whereby dislodged particles that escape from the shield tend to be carried away from the wafers being processed.

In another feature of the present invention, the particulate shield is made of a maeerial selected from the group consisting of quartz and carbon, whereby release of particles from the shield is reduced in use.

In another feature of the present invention, the male conductors of the RF connector are covered with a quartz sheath, whereby flaking of particles from the sheath is reduced in use.

Other features and advantages of the present invention will become apparent upon a perusal of the following specification taken in connection with the accompanying drawings wherein:

BRIEF DESCRIPTION OF THE DRAWINGS

FIG. 1 is a schematic, longitudinal sectional view, partly in block diagram form of a plasma enhanced chemical vapor processing apparatus incorporating features of the present invention, FIG. 2 is a transverse, sectional view of a portion of the structure of FIG. 1 taken along the line 2—2 in the direction of the arrows, FIG. 3 is an enlarged, transverse, forshortened, detail view of a portion of the structure of FIG. 2 delineated by line 3—3.

DESCRIPTION OF THE PREFERRED EMBODIMENTS

Figure 4:
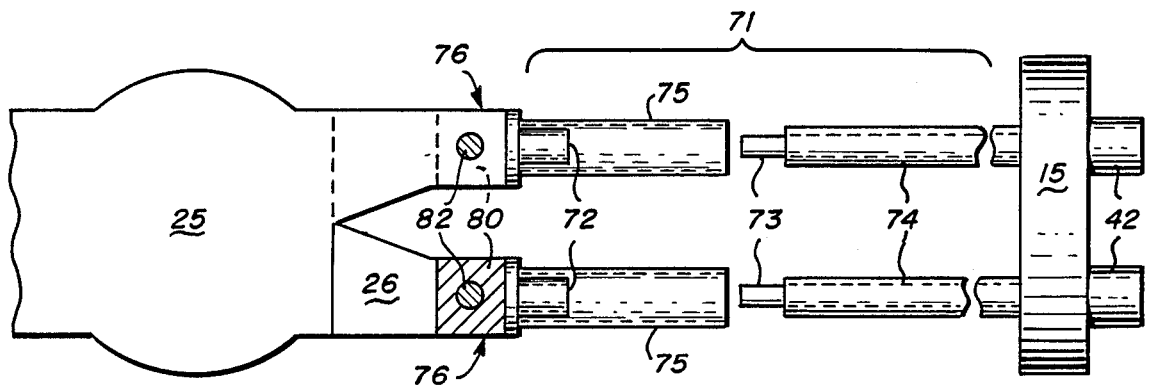
FIG. 4 is a side elevational view, partly broken away, of a protion of the structure of FIG. 1 delineated by line 4—4 and showing the shielded RF connector of the present invention in the uncoupled state.

Referring now to FIGS. 1 and 2, there is shown a plasma enhanced chemical vapor processing apparatus 11 for processing semiconductive wafers and incorporating features of the present invention. The processing system 11 includes an elongated, tubular, evacuable envelope 12, as of quartz, having an inside diameter of 155 to 300 millimeters. Opposite ends of the tubular envelope 12 are outwardly flanged at 13 and 14, respectively, to receive closing end caps structures 15 and 16, respectively, as of aluminum. Rubber 0-ring seals 17 and 18, respectively, provide a gas-tight seal between the respective end caps 15 and 16 and the flanged ends of the tubular envelope 12.

A three segment resistance heating element 19, 21 and 22 surrounds the tubular envelope 12. The resistance heating elements are heated to the desired temperature by means of current fed therethrough from a thermal controller 23. Thermocouples, not shown, are contained within the envelope for sensing the temperature therein. The output current from the thermal controller 23 is adjusted for obtaining the desired operating temperature within the tubular envelope, furnace tube 12. The heating element is surrounded by a thermally insulative jacket 24 as of asbestos. The thermal controller 23, heating elements, and insulative jacket comprise a furnace which is commercially available as a diffusion furnace.

First and second sets of interleaved generally planar elongated electrodes 25 and 26 (See FIGS. 1-3.) are diposed within the central region of the elongated tubular envelope 12 for defining a processing boat having a plurality of processing gaps 27 in the spaces between the interleaved electrodes 25 and 26. In a typical example, there are seven interleaved electrode plates 25 and 26, as of graphite, to define six processing gaps 27. The boat is inserted within the tube 12 by means of a cantilever system which is withdrawn after insertion.

The electrodes 25 and 26 of the boat are held together in electrically insulative relation by means of electrically insulative ceramic rods 29 passing transversely through aligned openings in the electrodes 25 and 26. Centrally apertured electrical insulator bodies 31, as of ceramic, are slipped onto the rods 29 for spacing the electrodes 25 and 26 apart. The assembly is held together by graphite nuts, not shown, threaded onto the ends of the ceramic rods 29.

The semiconductive wafers 38, which are to be processed, are disposed with one major face adjacent the electrode 25 or 26 and the other major face facing into the processing gap 27. The wafers 38 are attached to the electrodes 25 and 26 by tabs, not shown.

The first and second interleaved electrode sets 25 and 26 are connected to opposite terminals of an RF power supply 41 via the intermediary of hermetically sealed electrical feedthroughs 42 passing through end cap 15. The feedthroughs 42 are coupled to the respective electrodes sets 25 and 26 within the tubular envelope 12, so that when one set of the electrodes, for example 25, is positive, the other set of electrodes 26 is negative with a peak-to-peak potential difference V, as of 1,000 V, between the electrodes. In a typical example, the RF generator 41 has a frequency of 450 kilohertz.

The evacuable envelope 12 is evacuated by means of a roots blower 47 and a mechanical vacuum pump 48 connected in gas communication with envelope 12 via exhaust port 49 centrally disposed of the end cap 15, and exhaust tubulation 51. A particle filter 52 is connected in the exhaust tubulation for collecting particulate matter and preventing the back streaming of oil and other contaminants from the vacuum pumps 47 and 48 back into the evacuated envelope 12. A vacuum gauge 53 is coupled into the exhaust tubulation 51 for monitoring the pressure within the evacuable envelope 12 and a valve 54 is connected in the exhaust tubulation 51 for valving-off the system 11 from the pumps 47 and 48.

Gases to be employed in the chemical vapor processing apparatus 11 are contained within bottles 61 connected in gas communication with the evacuable envelope 12 via tubulation 62 and flow controllers 63. The output of the flow controllers 63 is fed to respective manifolds 64 and 65 which are connected to radially directed flow passageways 66 and 67, respectively, located in the same side in end cap 16 and feeding into envelope 12. In operation, the flow of the gaseous vapor constituents is axially of the evacuable tubular envelope 12 and interleaved electrode structure 25 and 26 (boat) to the exhaust port 49 and thence via the exhaust tubulation 51 to the pumps 47 and 48.

Referring now to FIG. 4, there is shown an RF connector 71 for making the electrical connection between the slidable wafer processing boat and the RF power supply 41 disposed outside the evacuable furnace tube 12. The connector 71, in FIG. 4, is shown in the decoupled state. The connector 71 includes a central recessed female portion 72, as of Inconel, for coaxial, slidable mating engagement with a male rod portion 73, as of Inconel. The rod portion 73 is covered by a closely fitting coaxial sheath 74, as of quartz, except for the end portion which is to be received within the female portion 72 for completing the electrical connection.

The female portions 72 are surrounded by cylindrical particle shield members 75, as of quartz. The shields 75 are flared at one end and fixedly coupled at their flared ends to vertically displaced receptical portions 80 carried from the inner ends of the electrodes 25 and 26 via screws as of graphite, not shown.

The electrodes 25 of one set of interleaved electrodes are notched out at their inner bottom end portions, whereas the other set of electrodes 26 are notched out at their top end portions so as to provide longitudinally protruding extensions at their inner ends, one at the top and the other at the bottom of the boat. The inner ends of each set of electrodes 25 and 26 are electrically and mechanically interconnected by a plurality of centrally apertured graphite blocks 80 with one block interposed between each pair of adjacent electrodes of a given set, 25 or 26. Graphite rods 82 pass transversely through the apertured blocks 80 and respective electrodes 25 and 26. The rods 82 are secured at their ends to the respective electrodes 25 or 26 via nuts as of graphite, not shown. In this manner, each of the electrode sets 25 and 26 are electrically interconnected in electrically insulative relation relative to the other set of electrodes.

The flanged particle shield tubes 75 and female receptacle portions 72 are secured to the respective blocks 80 by Inconel screws, not shown. The electrical connector rods 73 pass through the end cap 15 of the furnace tube 12 via the conventional hermetically sealed feedthroughs 42.

Figure 5:
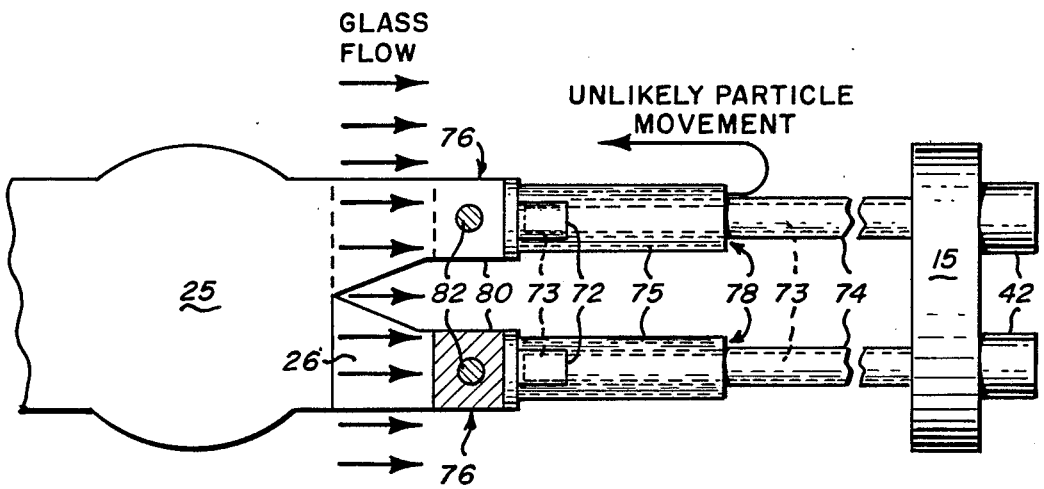
FIG. 5 is a view similar to that of FIG. 4 showing the RF connector of the present invention in the coupled state.

In operation, the wafer boat is loaded with wafers and rectilinearly translated axially of the furnace tube 12 toward the closed end 15. As the boat nears the end of the tube 12, the rods 73 slidably engage the female portion 72 and slide into good, electrical contact therewith. The particle shield 75 then surrounds the mated RF connectors 71, as shown in FIG. 5.

In the mated position, the open end 78 of the shield 75 is disposed downstream of the axial flow of processing gas. Particles dislodged by connecting and disconnecting the RF connector 71 tend to be confined within the surrounding shield 75. Particles which escape from the shield 75 tend to be carried downstream of the gas flow and thus away from the wafers being processed. In this manner, particle contamination of the wafers 38 during processing is reduced in use.

The advantage of the present invention is that the particulate contamination is reduced in use.

What is claimed is:

1. In a plasma enhanced chemical vapor processing boat for processing workpieces within an evacuable envelope containing the plasma enhanced chemical vapor and workpieces at substmospheric pressure:

first and second sets of electrode means for disposition within the envelope, one set of said electrode means being electrically insulated from the other and said first and second sets of electrode means being interleaved with each other for establishing, when energized with electrical potential, an electrical plasma discharge within said evacuable envelope in the processing gaps between adjacent ones of said interleaved electrode means;

electrical connector means for disposition within said evacuable envelope for making electrical connection to said electrode means and having slidably mating male and female portions disposed within said envelope; and shield means disposed surrrounding said mating male and female portions for at least partially containing particulates released from the slidably mating male and female portions, whereby particulate contamination of said workpieces is reduced in use.

2. The apparatus of claim 1 wherein said shield means is made of a material selected from the group consisting of quartz and carbon.

3. The apparatus of claim 1 including manifold means for flowing vapor through said evacuable envelope and serially through said interleaved electrode means and over said electrical connector means in that order for replenishing vapor depleted by the chemical vapor processing of the workpieces; and wherein said shield means includes an open end portion facing downstream of the flow of vapor over said electrical connector means, whereby particulates released by said mating connector portions tend to be restrained from flowing upstream to contaminate the workpieces within said interleaved electrode means.

4. The apparatus of claim 3 wherein said evacuable envelope is elongated and closed off at its downstream end by an end wall portion and further including, electrical feedthrough means for feeding a pair of electrical conductors through said end wall portion in a gastight manner, said pair of electrical conductors as fed through said envelope being elongated to define said male portions of said electrical connector means, and wherein said female portion of said connector means is carried from and movable with said first and second electrode means.

5. The apparatus of claim 4 including a pair of elongated quartz sheaths, one enclosing a portion of each of said elongated electrical conductors.

6. The apparatus of claim 5 wherein said particle shield means is disposed to receive therewithin a portion of said elongated quartz sheaths.

* * * * *